(12) United States Patent
Kopp et al.

(10) Patent No.: US 6,930,241 B2
(45) Date of Patent: Aug. 16, 2005

(54) SHIELDING DEVICE IN A TRANSITIONAL AREA BETWEEN A HOUSING AND A CABLE

(75) Inventors: Thomas Kopp, Wolfach (DE); Hermann Dieterle, Wolfach (DE)

(73) Assignee: VEGA Grieshaber KG, Wolfach (DE)

( * ) Notice: Subject to any disclaimer, the term of this patent is extended or adjusted under 35 U.S.C. 154(b) by 0 days.

(21) Appl. No.: 10/858,393

(22) Filed: Jun. 2, 2004

(65) Prior Publication Data

US 2004/0256130 A1 Dec. 23, 2004

(30) Foreign Application Priority Data

Jun. 12, 2003 (DE) ......................................... 103 26 475

(51) Int. Cl.⁷ ................................................. H06K 9/00
(52) U.S. Cl. ...................... 174/35 C; 439/578; 439/610
(58) Field of Search ............................ 174/35 R, 35 C; 439/578, 610

(56) References Cited

U.S. PATENT DOCUMENTS 6,576,833 B2 * 6/2003 Twiss et al. ........... 174/35 GC
6,639,146 B1 * 10/2003 Chiu ........................ 174/35 R
6,800,805 B2 * 10/2004 Deguchi ................ 174/35 GC

FOREIGN PATENT DOCUMENTS

DE 297 01 838 U1 10/1998

* cited by examiner

Primary Examiner—Hung V. Ngo
(74) Attorney, Agent, or Firm—Nath & Associates PLLC; Gregory B. Kang; Derek Richmond

(57) ABSTRACT

The invention relates to a shielding device in a transitional area between a housing (1,11) and a cable (3), wherein the housing (1,10,11) consists of an electrically insulating and/or electromagnetically insufficiently shielding material, an inner housing (12) with an electrically conductive material for forming an electromagnetic shielding for its inner chamber is arranged inside the housing (1,11,10), the cable (3) is designed with at least one line (30) and a cable shielding (31) for forming an electromagnetic shielding for the at least one line, and a cable connection device (4) is arranged for connecting the cable to the inner housing and for connecting the at least one line to a line connection device (18) on the inner housing in the transitional area.

Figure 1:
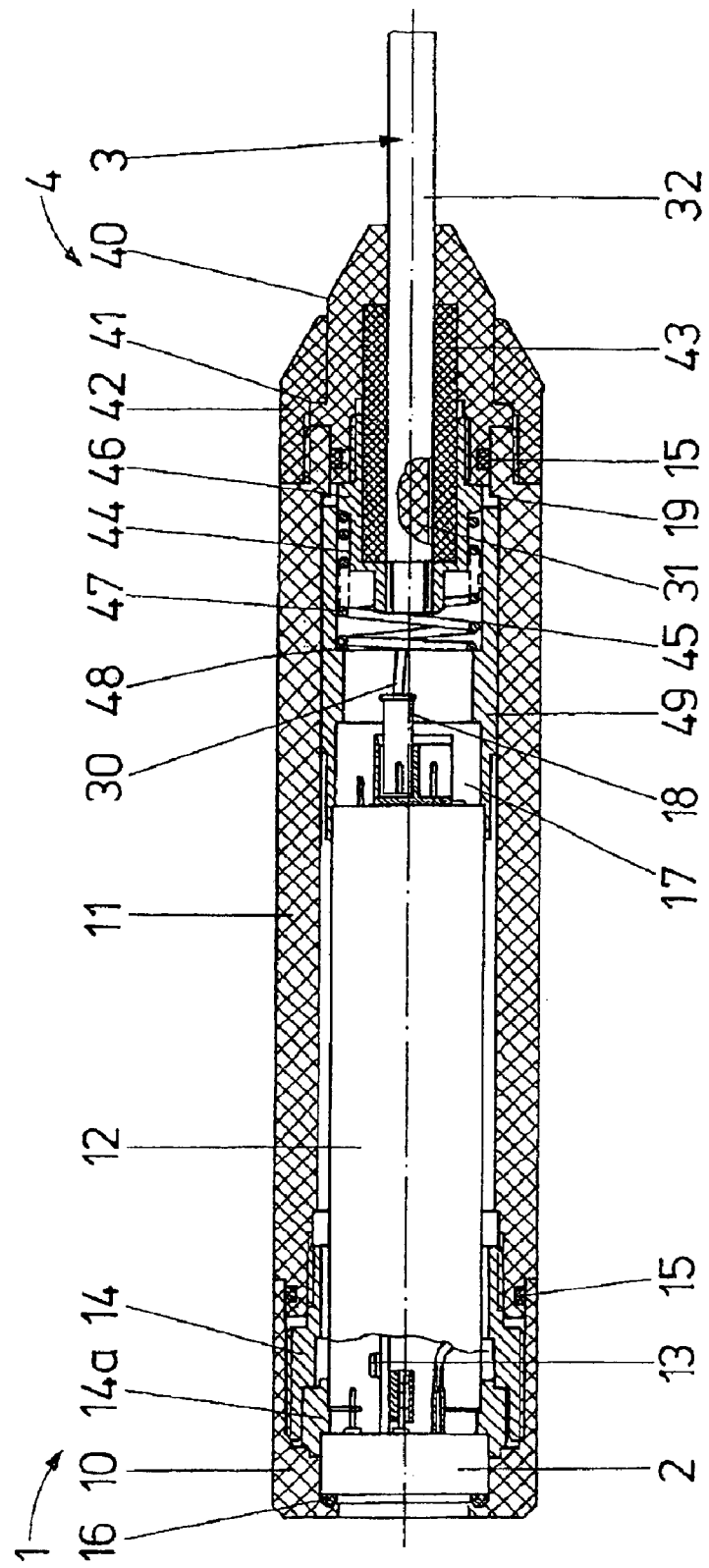

It is suggested for forming a continuous shielding even in the translational area that the cable shielding (31) be brought in contact with an electrically conductive spring stop (46) on the cable side, and that a spring be brought in contact via the cable-side spring stop (46) with an electrically conductive housing-side spring stop (48) with the inner housing (12).

10 Claims, 1 Drawing Sheet

SHIELDING DEVICE IN A TRANSITIONAL AREA BETWEEN A HOUSING AND A CABLE

The invention is relative to a shielding device in a transitional area between a housing and a cable in accordance with the generic features of claim 1.

Cables are known that end in a housing. Lines running in the cable and electronic components and lines located in this housing are to be protected against external electromagnetic influences. For example, pressure measuring devices, also called suspension pressure measuring devices, e.g., the Vegawell 72 of the applicant, with a pressure sensor in a housing are known. A cable runs out of the housing for transferring measured values of the pressure sensor that also assures, in addition to the electrical connection, the mechanical suspension of the sensor in the container. Such cables consist of a central line arrangement, of a metallic shield mesh around the latter to shield against external electromagnetic influences and of a jacket of elastic plastic. The pressure measuring devices, that are frequently operated under disturbing electromagnetic influences, are designed with a metallic housing that brings about the shielding of the inner components. In order to shield the transitional area between the cable and the housing as well as possible, the cable shield formed by the shield mesh is connected to the metallic housing via the shortest possible path. In this manner a Faraday cage remains closed over the electronic unit and over the lines running to and from it.

For many measuring tasks nonmetallic outer housings are also known consisting, e.g. of plastic, especially polyvinylidene fluoride (PVDF), in which the cable shield cannot be directly connected to a shielding of the electronic housing components during a subsequent connecting of cable and housing since the electronically relevant components and possibly an inner housing are surrounded by the plastic, that has no shielding properties against electromagnetic irradiations.

The invention has the problem of designing a shielding device for a transitional area between a housing consisting of an electromagnetically non-shielding material, a shielded cable and a shielding inner housing in such a manner that the transition from the cable to the inner housing remains shielded, and that in particular the shielding of the cable makes contact with the inner housing in order to form a continuous Faraday cage via the shortest path.

This problem is solved by a shielding device in a transitional area between a housing and a cable with the features of claim 1. An assemblage in accordance with the method constitutes the subject matter of claim 10.

A shielding device in a transitional area between a housing and a cable is improved, wherein the housing consists of an electrically insulating or electromagnetically non-shielding material and comprises an inner housing with an electrically conductive material for forming an electromagnetic shielding for its inner chamber, which inner housing is arranged inside the housing. The cable comprises at least one line and a cable shielding for forming an electromagnetic shielding for the at least one line. A cable connection device serves for a subsequent and/or detachable connecting of the cable to a cable connection inner housing section on the inner housing and serves to connect the at least one line to a line connection device on the inner housing in order to bring the cable line in contact with a line and/or an electronic component inside the inner housing. The improvement is brought about in that the cable shielding is brought in contact with, especially can also be permanently connected to an electrically conductive spring stop on the cable side, and in that a pressure spring, especially a spiral spring, brings the cable-side spring stop in contact with an electrically conductive, housing-side spring stop on the inner housing. This establishes a continuous electrical line from the cable shielding via the pressure spring to the inner housing. If a spiral spring is used as pressure spring with a small spacing in its composed state between the individual spiral spring windings a Faraday cage effect is already produced for appropriate electromagnetic frequency ranges.

Advantageous embodiments form the subject matter of dependent claims.

The fixing of the cable-side spring stop to the cable has the advantage on the one hand that the spring stop cannot slip off or be lost as a loose part during manipulations during assembly or if the cable is subsequently loosened from the housing. On the other hand, the cable-side spring stop permanently connected to the cable has the advantage that it forms a support for the spring so that the spring is stressed directly with the introduction of the cable into the housing against the housing-side spring stop.

The cable-side spring stop advantageously comprises an outside fastening stop for a cable tensioning device for fixing the cable and/or the cable-side spring stop on the housing. Consequently, the cable must not be grasped and pressed together with the spring stop fastened to it into the housing but rather the common tensioning of cable and cable-side spring stop element against the spring can be carried out by a separate cable tensioning device, e.g., a screw cap. In particular, the force of the cable tensioning device is transmitted directly via the cable-side spring stop element onto the spring so that the actual cable is acted on solely by a force that also draws it into the housing, which reduces the danger of damage to the cable.

The housing-side spring stop is advantageously designed on, especially in a contact casing extending over the housing-side spring stop further towards the inner housing. This makes possible an optimal design of a Faraday cage by means of the contact casing completely surrounding the line and the spring as well as the transitional area toward the inner housing. A contact casing is especially preferred that extends so far inside the housing that the contact casing surrounds in a shielding electromagnetic manner the end of the fastened cable with the cable shielding as well as the cable-side end of the inner housing.

In order to make possible simpler manipulations during assembly, in particular to prevent the contact casing from sliding out during a subsequent loosening of the cable from the housing, the housing is advantageously designed in a multipartite manner and comprises a cable-side retention stop for retaining the contact casing and/or the inner housing if a cable tensioning device is not fastened to the housing. In a preferred embodiment the housing is a cable connection housing. The housing can also be designed with advantage as a sensor housing and receive a sensor element. In the case of a suspension pressure measuring device a sensor element is inserted, e.g., on the front side in the housing shielded in this manner on the interior for receiving an ambient pressure on the front side and a cable is inserted on the back side for transferring measured values of the sensor element to a remote device.

An embodiment is described in detail in the following with reference made to the drawing.

FIG. 1 shows an insulating housing with a sensor element, with an electrically shielding inner housing with sensor electronic components, with a connected, shielded cable and with a shielding device for electromagnetically shielding the transfer area from the cable to the inner housing.

FIG. 1 shows housing 1, in which sensor element 2, in particular pressure- and/or temperature sensor element 2 is inserted. Data and/or signals received with sensor element 2 are conducted via cable 3 running out of the back of housing 1 to an external data processing device or the like. Cable connection device 4 serves for structural fastening and electrical contacting of cable 3 on the housing. The concepts front side and back side are used only to illustrate in a simpler manner the alignment of various elements to each other shown by way of example.

Housing 1 consists of an electromagnetically non-shielding or electrically insulating material, which also includes an electromagnetic shielding that is insufficient for the purposes of electronic components and electrical lines contained in the housing. An example of a conventional material for housing 1 is PVDF.

The housing comprises front housing part 10 that contains the actual sensor element 2 and is fixed on rear housing part 11. Rear housing part 11 contains inner housing 12 consisting, as a housing for electronic components, of a metal that shields electromagnetic fields. Inner housing 12 contains electronic device 13 for processing data detected by sensor element 2 and optionally for controlling sensor element 2. Housing fastening device 14 contained on the inside of back housing part 11 and of front housing part 10 serves to secure sensor element 2 on inner housing 12 by securing front housing part 10 and back housing part 11 against one another. Housing fastening device 14 is designed in the embodiment shown as a structural element with a front outer thread and a rear outer thread which outer threads mesh with corresponding inner threads on the inside of front housing part 10 and on the inside of back housing part 11. Housing seals 15 and sensor/housing seal 16 serve to seal front housing part 10 against back housing part 11 and against sensor element 2, which seals are inserted appropriately between the specified elements. Sensor element 2 and inner housing 12 are additionally connected in an electrically conductive manner (e.g., welded or adhered with an electrically conductive adhesive) by fastening ring 14a shielding their transitional area.

Whereas shown housing 1 has a substantially cylindrical construction and therefore makes possible such screw connections and the use of simple O-ring seals, other constructions can also be used.

Inner housing 12 comprises cable connection inner housing section 17 on the back side or cable side that is provided with line connection device 18, especially contact springs and pins for the connection of lines.

Cable 3 runs into housing 1 on the back side. Cable 3 consists in particular of at least one, preferably several central lines 30 surrounded by cable shielding 31. Cable shielding 31 can be designed in a customary manner as a shield mesh. Cable shielding 31 is surrounded by jacketing 32 consisting typically of a plastic material. Cable shielding 31 and the at least one line 30 extend on the front side out of jacketing 32 in the direction of inner housing 12.

Shown cable connection device 4 consists of a plurality of components that can be reduced in number for changing the basic concept described.

The cable extends through sealing housing 40. Sealing housing 40 comprises tensioning element stop 41 on the outside wherein tensioning element stop 41 is designed as a circular stop in the preferred embodiment. Screw cap 42 serves to fix sealing housing 40 to cable 3 contained in it on the back end of back housing part 11. Screw cap 42 engages with an internal thread into a corresponding external thread on the back section of back housing part 11. Screw cap 42 presses when being screwed on back housing part 11 with a rear screw cap internal stop against tensioning element stop 41, as a result of which the latter and therewith sealing housing 40 and cable 3 are pressed against and into housing 1. Tensioning element 40 advantageously projects with its section located at the front of tensioning element stop 41 into the inner chamber of rear housing part 11. A groove with housing seal 15 contained in it is designed in this transitional area in back housing part 11 or, as shown, in the external circumference of front-side sealing housing 40.

Sealing housing 40 comprises a recess in this front central area which recess is especially cylindrical and in which cable seal 43 consisting of an elastic material is inserted. Cable seal 43 is dimensioned and inserted in such a manner that it on the one hand makes possible a sealing of the transition from the inner chamber of housing 1 via cable 3 to the environment and on the other hand a fixed and reliable holding of cable 3 in the sealing housing.

Sealing casing 44 is set over the front section of cable seal 43, preferably extends into the inner chamber of the recess of sealing housing 40 and is screwed in this area to sealing housing 40 in order to fix the two together. The front-side section of sealing casing 44 surrounds the front side of cable seal 43. Moreover, the front-side section of sealing casing 44 surrounds a section of cable 3 extending out of cable seal 43 on the front side, wherein section jacketing 32 was preferably removed and a contacting of the inner circumference of flange casing 45 with exposed cable shielding 31 takes place. Since sealing casing 44 and with it flange casing 45 are manufactured from an electrically conductive material, a contacting of cable shielding 31 with flange casing 45 and sealing casing 44 therefore takes place.

Sealing casing 44 has a cable-side spring stop 46 in the area of the outer circumference. Cable-side spring stop 46 of sealing casing 44 is tensioned against spring 47 with the housing-side stop surface when cable 3 is inserted with cable connection device 4 in housing 1 and is tensioned on it. Spring 47 extends spatially further into the inner chamber of housing 1 in the direction of inner housing 12. Housing-side spring stop 48 functions as support for spring 47. However, in the preferred embodiment an inside stop of contact casing 49, which casing extends for its part on the front side up to inner housing 12, functions as housing-side spring stop 48. Contact casing 49 rests permanently or is fixed permanently on inner housing 12 so that an electrical contact is established between inner housing 12 and contact casing 49, that both consist of an electrically conductive and electromagnetically shielding material. In the embodiment shown the contact casing 49 has an inside stop that is pressed by the pressure of spring 47 against the cylindrical outer circumference of inner housing 12 or of cable connection inner housing section 17 of it. Contact casing 49 comprises housing-side spring stop 48 as support for spring 47 on the back or spring side.

As a result of the fact that inner housing 12, contact casing 49, spring 47, sealing casing 44 and flange casing 45 consist of an electrically conductive material with an electromagnetically shielding quality, a continuous electromagnetic shielding is present from cable shielding 31, which is in contact with flange casing 45, up to inner housing 12.

In order to prevent falling of contact casing 49 out of back housing part 11 during assembly or disassembly of cable 3 on said back housing part, back housing part 11 comprises housing stop 19 for contact casing 49 in the vicinity of the back end section of housing 1.

The assembly of the entire device takes place as described in the following.

First, fastening ring 14a is pushed onto sensor element 2. Subsequently, electronic device 13 is pushed onto the sensor element and the inner housing/electronic component housing 12 is set on fastening ring 14a, where it is stopped. The unit consisting of elements 14a, 2, 13 and 12 formed in this manner is inserted together with seal 16 attached on the front side into front housing part 10 and fixed with fastening device 14. Then, contact casing 49 is pushed onto inner housing/electronic housing 12 and housing seal 15 set on back housing part 11 and finally back housing part 11 is screwed onto 14. Spring 47 is set into back housing part 11 and then the cable preassembly takes place.

This cable preassembly provides that screw cap 42, sealing housing 40, cable seal 43 and cable-side spring stop 46 are pushed over jacketing 32 or cable 3. Then, cable-side spring stop 46 is screwed fast in sealing housing 40. Then, flange casing 45 is inserted into spring stop 46 and pressed. Finally, seal 15 is set onto sealing housing 40 and line connection device 18 connected to line 30 in cable 3.

Then, line 30 is fit on electronic device 13 and sealing housing 40 is inserted. Finally, screw cap 42 is screwed fast.

In a preferred embodiment the basic concepts are that the shield mesh is connected as shielding 31 of connection cable 3 to the electronic component housing or inner housing 12 consisting of metal in such a manner that cable shielding 31 is pressed with flange casing 45 and sealing casing 44, sealing casing 44 is contacted by spring 47 preferably designed as a pressure spring, in a next step spring 47 is brought in contact with contact casing 49 and finally contact casing 49 is brought in contact with the electronic component housing or inner housing 12. Contact casing 49 advantageously extends over spring 47 thereby in the direction of the inner housing for a shielding also of the area of line connection device 18 for connection of a line or lines 30 to the electronic components of inner housing 12 to be electromagnetically shielded.

As a result of the fact that the back side housing part of housing 1 comprises inside housing stop 19 for contact casing 49, contact casing 49 cannot fall out of housing 1 during the loosening of screw cap 12 [sic; 42] or of cable connection device 4 from back housing part 11.

Many variants of the embodiment are possible. For example, it is sufficient if inner housing 12 is coated only with an electrically conductive material instead of being constructed itself from a massive metallic housing.

Whereas an inside housing stop 19 is described for contact casing 49 in the preferred embodiment, for example, the designing of housing stop 19 directly for inner housing 12 is possible if, e.g., a contact casing 49 has not been made available.

Whereas the cited and described elements have a substantially cylindrical cross section, the basic principle can also be transferred to other cross sections of the individual elements, e.g., square cross sections.

| List of reference numerals: | |
|---|---|
| 1 | Housing (PVDF) |
| 10 | Front housing part |
| 11 | Back housing part |
| 12 | Inner housing/electronic component housing (metal) |
| 13 | Electronic device |
| 14 | Electronic component housing device/fastening device (10 to 11) |
| 14a | Fastening ring |
| 15 | Housing seal |
| 16 | Sensor seal/housing seal |
| 17 | Cable connection inner housing section |
| 18 | Line connection device/cable springs and pins |
| 19 | Housing stop for contact casing 49 |
| 2 | Sensor element |
| 3 | Cable |
| 30 | Lines in cable |
| 31 | Cable shielding |
| 32 | Jacketing |
| 4 | Cable connection device |
| 40 | Sealing housing (cable-side) |
| 41 | Tensioning element stop for 42 |
| 42 | Screw cap for 40, 41, 11 |
| 43 | Cable seal |

| -continued | |
|---|---|
| List of reference numerals: | |
| 44 | Sealing casing |
| 45 | Flange casing |
| 46 | Cable-side spring stop |
| 47 | Spring (spiral spring) |
| 48 | Housing-side spring stop |
| 49 | Contact casing |

What is claimed is:

1. Shielding device in a transitional area between a housing (1,11) and a cable (3), in which the housing (1,10,11) consists of an electrically insulating and/or electromagnetically insufficiently shielding material and an inner housing (12) with an electrically conductive material for forming an electromagnetic shielding for its inner chamber is arranged inside the housing (1,11, 10), the cable (3) is designed with at least one line (30) and a cable shielding (31) for forming an electromagnetic shielding for the at least one line (30), and a cable connection device (4) is arranged for a subsequent and/or detachable connecting of the cable (3) to a cable connection inner housing section (1) of the inner housing (12) and for connecting the at least one line (30) to a line connection device (18) on or in the inner housing (12) in the transitional area, characterized in that the cable shielding (31) is brought in electrical contact with an electrically conductive spring stop (46) on the cable side, and that a spring, especially a spiral pressure spring (47), is brought in contact via the cable-side spring stop (46) with an electrically conductive housing-side spring stop (48) with the inner housing (12).

2. Shielding device according to claim 1, in which the cable-side spring stop (46) is permanently connected to the cable (3) and is designed for stressing the spring (47) against the housing-side spring stop (48) when fixing the cable (3) on the housing (1,11).

3. Shielding device according to claim 2 in which the cable-side spring stop (46) comprises an external fastening stop (41) for a cable tensioning device (40,42) for fixing the cable (3) and/or the cable-side spring stop on the housing (1,11).

4. Shielding device according to claim 1, in which the housing-side spring stop (48) is designed on, especially in a contact casing (49).

5. Shielding device according to claim 4, in which the contact casing (49) extends inside the housing (1,11) surrounding in an electromagnetically shielding manner the end of the fastened cable (3) with the cable shielding (31) as well as surrounding in an electromagnetically shielding manner the spring (47) an the cable-side and of the inner housing (12,17), wherein the contact casing (49) extends further over the housing-side spring stop (48) up to the inner housing (12).

6. Shielding device according to claim 4, in which the housing (1,10,11,14) is designed in a multipartite manner and comprises a cable connection-side retention stop (19) for retaining the contact casing (49) and/or the inner housing (12) when there is no cable tensioning device (4) fastened on the housing (1).

7. Shielding device according to claim 1, in which the housing (1) is a cable connection housing.

8. Shielding device according to claim 1, in which the housing (1) is a sensor housing and contains a sensor element (2).

9. Shielding device according to claim 8, in which the housing (1) is part of a suspension pressure measuring device.

10. Method of assembling a housing (1) and a cable (3) with the aid of a shielding device (4,12,31) in accordance with claim 1, wherein a spring (47) consisting of an electrically conductive material is inserted into the housing (1) containing an inner housing (12) shielding electromagnetic waves, the cable (3) is brought into electrical contact with a cable-side spring stop consisting of an electrically conductive material for the cable shielding (3) and is inserted into the housing (1), and wherein the cable-side spring stop (46) is pressed against the spring (47) in such a manner that the spring (47) resting on a housing-side spring stop (48) of the inner housing (12) as support forms an electrical connection from the cable shielding (31) via the cable-side spring stop (46), the spring (47) and the housing-side spring stop (48) to the inner housing (12).

* * * * *

UNITED STATES PATENT AND TRADEMARK OFFICE
CERTIFICATE OF CORRECTION

PATENT NO. : 6,930,241 B2
DATED : August 16, 2005
INVENTOR(S) : Kopp et al.

It is certified that error appears in the above-identified patent and that said Letters Patent is hereby corrected as shown below:

Column 6,
Line 26, please delete "(1)" and replace with -- (17) --.

Column 8,
Line 1, please delete "(3)" and replace with -- (31) --.

Signed and Sealed this

Eighteenth Day of October, 2005

JON W. DUDAS
*Director of the United States Patent and Trademark Office*